(12) United States Patent
Ching et al.

(10) Patent No.: US 12,218,136 B2
(45) Date of Patent: Feb. 4, 2025

(54) SEMICONDUCTOR DEVICE HAVING A FIN AT A S/D REGION AND A SEMICONDUCTOR CONTACT OR SILICIDE INTERFACING THEREWITH

(71) Applicant: TAIWAN SEMICONDUCTOR MANUFACTURING CO., LTD., Hsinchu (TW)

(72) Inventors: Kuo-Cheng Ching, Hsinchu County (TW); Ching-Wei Tsai, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 199 days.

(21) Appl. No.: 17/861,565

(22) Filed: Jul. 11, 2022

(65) Prior Publication Data
US 2022/0352164 A1 Nov. 3, 2022

Related U.S. Application Data

(60) Continuation of application No. 16/877,261, filed on May 18, 2020, now Pat. No. 11,387,237, which is a
(Continued)

(51) Int. Cl.
*H01L 27/092* (2006.01)
*H01L 21/285* (2006.01)
(Continued)

(52) U.S. Cl.
CPC .... *H01L 27/0924* (2013.01); *H01L 21/28525* (2013.01); *H01L 21/76831* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,105,490 B2   8/2015   Wang et al.
9,236,267 B2   1/2016   De et al.
(Continued)

OTHER PUBLICATIONS

Gluschenkov et al., "FinFET performance with Si:P and Ge:Group-III Metal Metastable Contact Trench Alloys", IEEE, Dec. 3, 2016.

*Primary Examiner* — Younes Boulghassoul
(74) *Attorney, Agent, or Firm* — Maschoff Brennan

(57) ABSTRACT

A semiconductor device includes a semiconductor fin, a gate structure, source/drain structures, and a contact structure. The semiconductor fin extends from a substrate. The gate structure extends across the semiconductor fin. The source/drain structures are on opposite sides of the gate structure. The contact structure is over a first one of the source/drain structures. The contact structure includes a semiconductor contact and a metal contact over the semiconductor contact. The semiconductor contact has a higher dopant concentration than the first one of the source/drain structures. The first one of the source/drain structures includes a first portion and a second portion at opposite sides of the fin and interfacing the semiconductor contact.

20 Claims, 13 Drawing Sheets

Related U.S. Application Data division of application No. 16/059,827, filed on Aug. 9, 2018, now Pat. No. 10,658,362.

(60) Provisional application No. 62/591,127, filed on Nov. 27, 2017.

(51) Int. Cl.

| | | |
|---|---|---|
| *H01L 21/768* | (2006.01) | |
| *H01L 21/8238* | (2006.01) | |
| *H01L 29/06* | (2006.01) | |
| *H01L 29/08* | (2006.01) | |
| *H01L 29/161* | (2006.01) | |
| *H01L 29/165* | (2006.01) | |
| *H01L 29/167* | (2006.01) | |
| *H01L 29/417* | (2006.01) | |
| *H01L 29/66* | (2006.01) | |
| *H01L 29/78* | (2006.01) | |
| *H01L 21/311* | (2006.01) | |

(52) U.S. Cl.
CPC .......... *H01L 21/76897* (2013.01); *H01L 21/823814* (2013.01); *H01L 21/823821* (2013.01); *H01L 21/823864* (2013.01); *H01L 21/823871* (2013.01); *H01L 29/0649* (2013.01); *H01L 29/0847* (2013.01); *H01L 29/167* (2013.01); *H01L 29/41791* (2013.01); *H01L 29/66545* (2013.01); *H01L 29/6656* (2013.01); *H01L 29/66795* (2013.01); *H01L 29/7851* (2013.01); H01L 21/28518 (2013.01); H01L 21/31116 (2013.01); H01L 21/76805 (2013.01); H01L 29/161 (2013.01); H01L 29/165 (2013.01); H01L 29/665 (2013.01); H01L 29/7848 (2013.01); H01L 2029/7858 (2013.01)

(58) Field of Classification Search
CPC .......... H01L 27/1211; H01L 27/10826; H01L 27/10879; H01L 29/41791; H01L 29/66795–66818; H01L 29/785–7856; H01L 2029/7857–7858; H01L 2924/13067; H01L 21/823418; H01L 21/823814; H01L 29/0847; H01L 29/66636; H01L 21/02532; H01L 29/161; H01L 29/167; H01L 21/76897; H01L 21/823475; H01L 21/823871; H01L 21/28525; H01L 21/76805; H01L 21/76816; H01L 23/5283; H01L 29/41725; H01L 29/41733; H01L 29/665; H01L 21/28518; H01L 21/32053; H01L 21/76889; H01L 27/092
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,096,524 B1 * | 10/2018 | Bi .................. H01L 29/66818 |
| 11,387,237 B2 * | 7/2022 | Ching .............. H01L 21/76831 |
| 2015/0303118 A1 | 10/2015 | Wang |
| 2016/0086950 A1 | 3/2016 | Eom |
| 2016/0093726 A1 | 3/2016 | Ching |
| 2017/0110578 A1 * | 4/2017 | Okuno .................. H01L 29/045 |
| 2017/0148797 A1 * | 5/2017 | Kim ...................... H01L 29/456 |
| 2017/0186654 A1 * | 6/2017 | Li .......................... H01L 29/45 |
| 2017/0221890 A1 * | 8/2017 | Wang .............. H01L 21/823481 |
| 2017/0338329 A1 * | 11/2017 | Pei .................... H01L 29/41791 |
| 2017/0365555 A1 | 12/2017 | Choi |
| 2018/0151565 A1 * | 5/2018 | Lee ........................ H01L 29/665 |
| 2018/0190810 A1 * | 7/2018 | Li ........................ H01L 29/0847 |
| 2018/0315663 A1 | 11/2018 | Bao |
| 2019/0035691 A1 * | 1/2019 | Okuno .................. H01L 27/0924 |
| 2019/0067444 A1 * | 2/2019 | Ching .............. H01L 21/02532 |
| 2019/0067445 A1 * | 2/2019 | Ching .................. H01L 29/785 |
| 2019/0067451 A1 * | 2/2019 | Ching .............. H01L 29/66621 |
| 2019/0096765 A1 * | 3/2019 | Ching ................ H01L 29/0653 |
| 2019/0273159 A1 | 9/2019 | Lee |

\* cited by examiner

SEMICONDUCTOR DEVICE HAVING A FIN AT A S/D REGION AND A SEMICONDUCTOR CONTACT OR SILICIDE INTERFACING THEREWITH

CROSS-REFERENCE TO RELATED APPLICATION

This application is a continuation application of U.S. patent application Ser. No. 16/877,261, filed May 18, 2020, now U.S. Pat. No. 11,387,237, issued Jul. 12, 2022, which is a divisional application of U.S. patent application Ser. No. 16/059,827, filed Aug. 09, 2018, now U.S. Pat. No. 10,658,362, issued May 19, 2020, which claims priority to U.S. Provisional Application Ser. No. 62/591,127, filed Nov. 27, 2017, all of which are herein incorporated by reference in their entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the feature size has decreased. The semiconductor integrated circuit industry has produced numerous developments in effort to continue the process of scaling. One of the developments is the replacement or supplementation of the conventional planar metal-oxide-semiconductor field-effect transistor by the vertical field-effect transistor. However, existing vertical field-effect transistors have not been satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
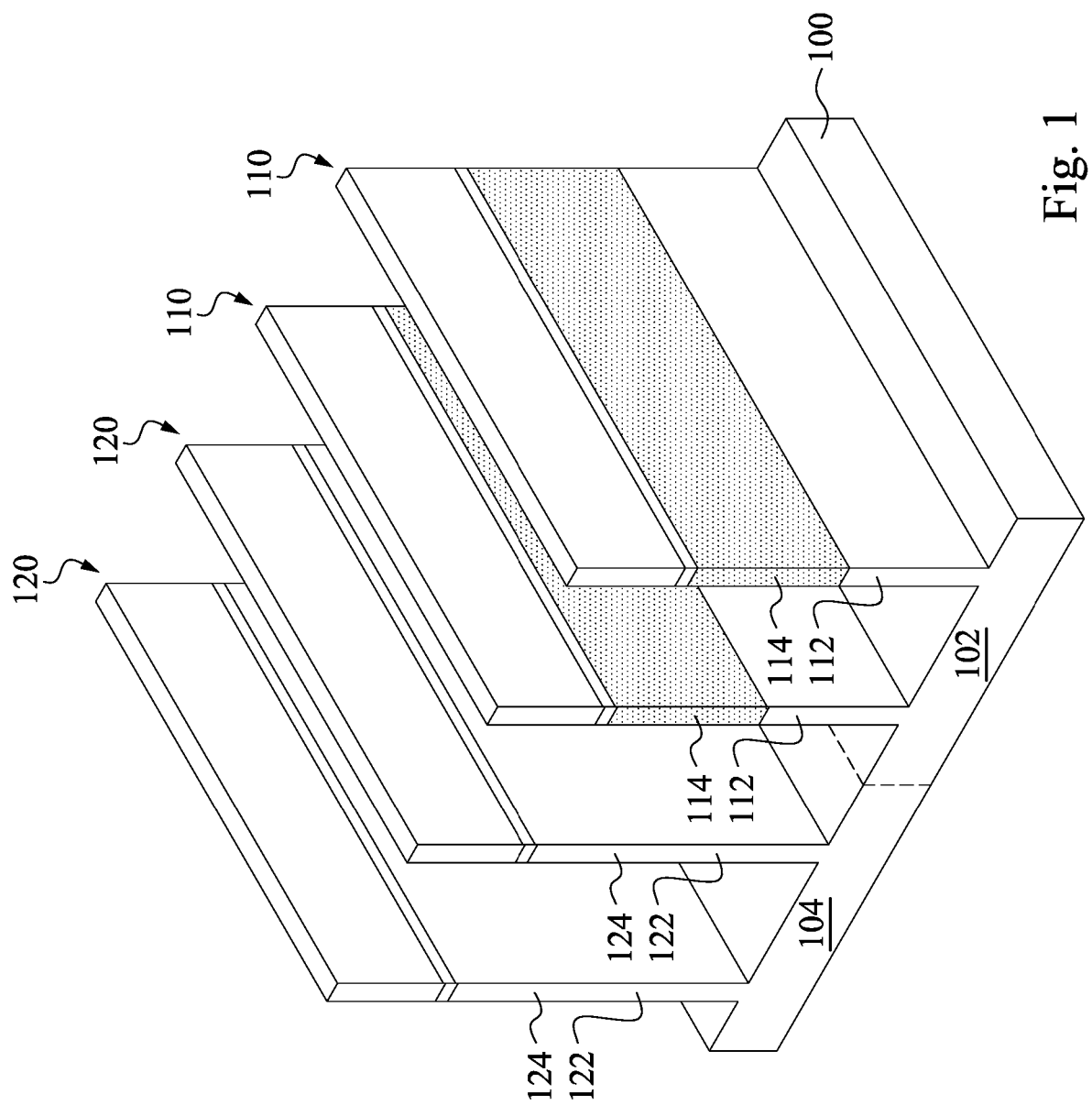
FIGS. 1-12 are cross sectional views illustrating various stages of a method of fabricating a semiconductor component according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-12 are cross sectional views illustrating various stages of a method of fabricating a semiconductor component according to some embodiments of the present disclosure. It is understood that additional steps can be provided before, during, and/or after the method, and some of the steps described below can be replaced, eliminated, and/or moved around for additional embodiments of the method. The method begins at forming a plurality of fins on a substrate, which is illustrated in FIG. 1.

In some embodiments, the substrate 100 has a P-type metal-oxide-semiconductor (PMOS) region 102 and an N-type metal-oxide-semiconductor (NMOS) region 104 thereon. The fins include a plurality of fins 110 and a plurality of fins 120 on the substrate 100, in which the fins 110 and 120 are respectively formed on the PMOS region 102 and the NMOS region 104.

In some embodiments, each of the fins 110 on the PMOS region 102 includes an upper portion 114 and a bottom portion 112. The upper portion 114 can be utilized as a channel portion and includes, for example, silicon germanium for the PMOS device. The bottom portion 112 includes, for example, silicon. In some embodiments, the upper portion 114 is formed by epitaxial growing silicon germanium material on the substrate 100, and the grown materials may be in situ doped during growth, which may obviate prior and subsequent implantations although in situ and implantation doping may be used together.

In some embodiments, the fins 120 are made of silicon. The fins 120 can be doped with p-type dopant, such as phosphorus or arsenic, and can be utilized as channel regions for the NMOS devices. One skilled in the art readily understands that the fins 110, 120 are shown for the illustrative purpose only, and more fins may be formed on the substrate 100.

In some embodiments, the fins 110, 120 may be fabricated using suitable processes including photolithography and etch processes. The photolithography process may include forming a photoresist layer overlying the substrate, exposing the photoresist layer by a patterned mask, performing a post-exposure bake process, and developing the photoresist layer to form a masking layer. An etching process may be carried out using the masking layer to form the fins 110, 120. Illustrative examples of the etching process include wet etching techniques and/or dry etching techniques such as plasma etching techniques, reactive ion etch (RIE) techniques and other suitable techniques.

In some embodiments, the fins 110, 120 may be formed by double-patterning lithography (DPL) process. DPL is a method of constructing a pattern on a substrate by dividing the pattern into two interleaved patterns. DPL allows to enhance feature (e.g., fin) densities. Various DPL methodologies that may be used include double exposure (e.g., using two mask sets), forming spacers adjacent features and removing the features to provide a pattern of spacers, resist freezing, and/or other suitable processes. One skilled in the art readily understands that the processes described above are just examples of the formation of the fins 110, 120.

The substrate 100 may be a semiconductor substrate, such as a semiconductor-on-insulator (SOI) substrate, a bulk semiconductor, or the like. Alternatively, the substrate may be a wafer, such as a silicon wafer. The SOI substrate may include a layer of a semiconductor material formed on an insulator layer. The insulator layer may be, for example, a silicon oxide layer, a buried oxide (BOX) layer, or the like. Other substrates, such as a multi-layered or gradient substrate may also be used.

Figure 2:
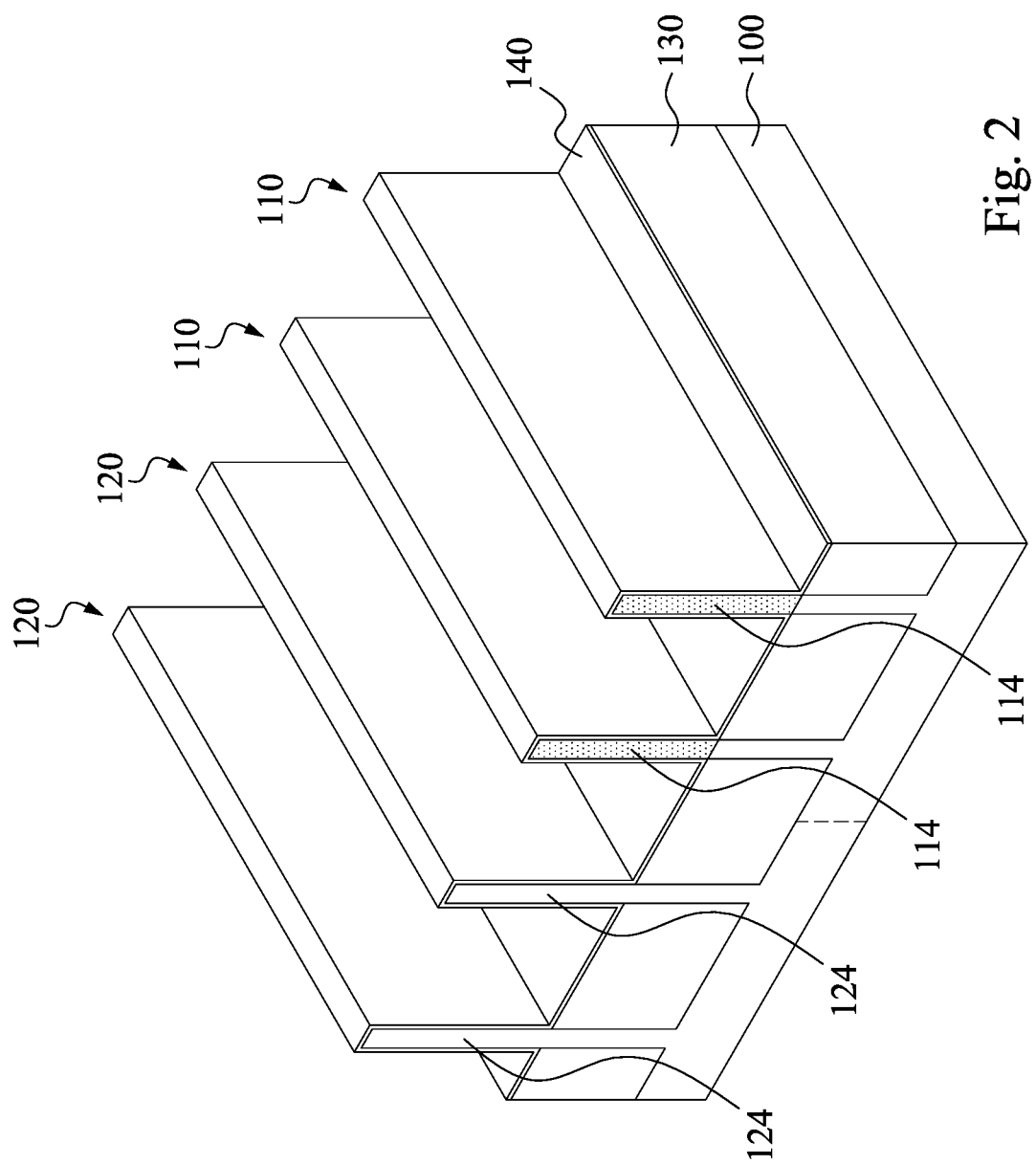

Reference is made to FIG. 2. A dielectric layer 130 is disposed over the substrate 100 and between the fins 110, 120. The dielectric layer 130 may be formed by a chemical vapor deposition (CVD) process, a sub-atmospheric CVD (SACVD) process, a flowable CVD process, an atomic layer deposition (ALD) process, a physical vapor deposition (PVD) process, and/or other suitable processes. In some embodiments, the dielectric layer 130 includes a layer of silicon oxide formed by a flowable CVD process. Nevertheless, other dielectric materials formed by any acceptable process may be used. In some embodiments, dielectric material is deposited and fills the spaces between the fins 110, 120. Then a recessing process, such as wet etching and/or dry etching, is performed to form the dielectric layer 130 between the fins 110, 120. In some embodiments, the dielectric layer 130 acts as shallow trench isolation (STI) structures. In some embodiments, at least the upper portions 114, 124 of the fins 110, 120 are protruded from the dielectric layer 130.

After the dielectric layer 130 is formed on the substrate 100 and between the fins 110, 120, a capping layer 140 is conformally formed on the dielectric layer 130 and on the fins 110, 120. The capping layer 140 may be formed by various approaches. In some embodiments, the capping layer 140 can be single layer or multilayer film. In some embodiments, the capping layer 140 is an oxide layer, such as $SiO_2$ or other suitable oxide materials.

In yet some other embodiments, an annealing process may be performed to densify the deposited dielectric layer 130. The capping layer 140 may protect the fins 110, 120 from oxidation during the annealing processes according to some embodiments. As discussed above, annealing processes may be carried out in order to improve the quality of the dielectric layer 130, in accordance with some embodiments. In the annealing processes, the substrate 100 is subjected into a surrounding at a temperature of about 900 degrees Celsius to about 1100 degrees Celsius or even higher in certain cases. At such high temperature, the fins 110, 120 are possibly oxidized due to the diffusion of oxygen from the dielectric layer 130 to the fins 110, 120. The oxidation of the fins 110, 120 unfavorably degrades the characteristics thereof. The capping layer 140 may block oxygen from diffusion into the fins 110, 120, and therefore protect the fins 110, 120 from oxidation during the annealing processes.

Figure 3:
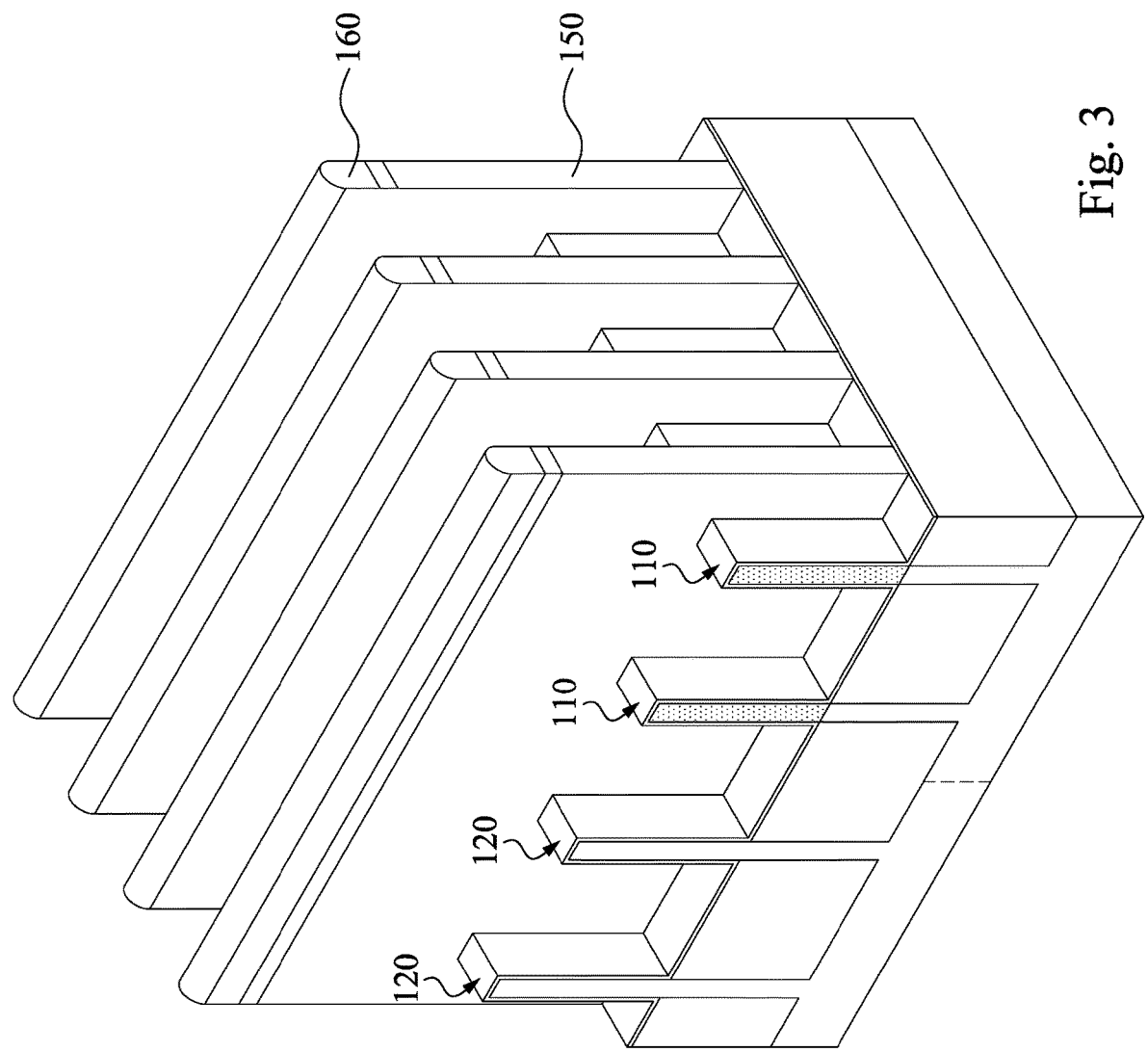

Reference is made to FIG. 3, a plurality of gate structures 150 are formed crossing over the fins 110, 120. In some embodiments, the gate structures 150 can be made by, for example, depositing a polysilicon layer covering the fins 110, 120, and patterning the polysilicon layer with mask features 160. In some embodiments, the gate structures 150 cover the middle portions of the fins 110, 120, and the portions of the fins 110, 120 crossed over by the gate structure 150 can serve as channel regions. The portions of the fins 110, 120 at opposite sides of the gate structures 150 can serve as source/drain regions.

Figure 4:
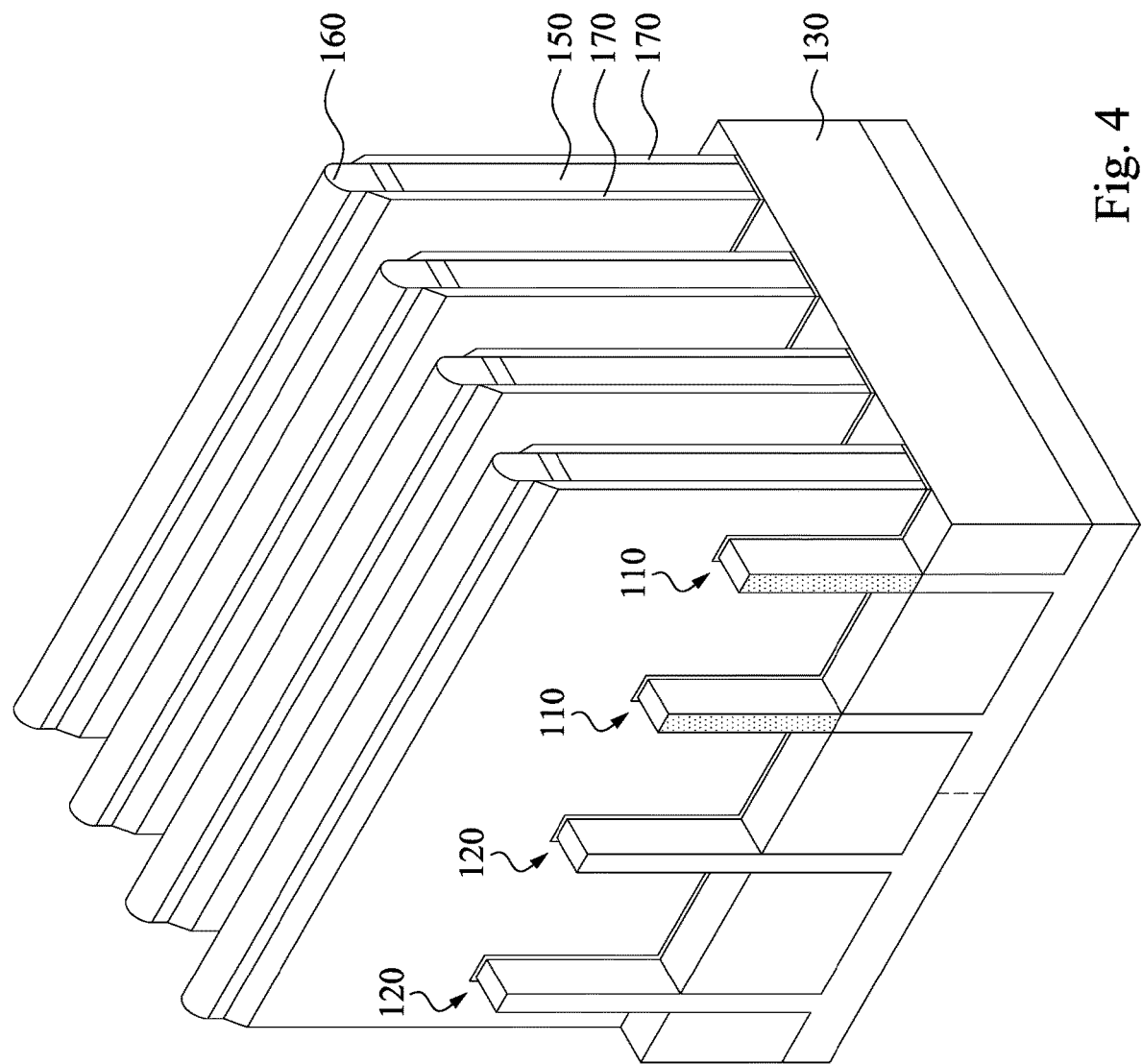

Reference is made to FIG. 4. A plurality of gate spacers 170 are formed at sidewalls of the gate structures 150. In some embodiments, a spacer layer is deposited on the fins 110, 120, and on the dielectric layers 130 as gate spacers. In some embodiments, the gate spacers 170 can be nitride layer, such as a silicon nitride layer.

In some embodiments, the spacer layer is deposited on the top and side surfaces of the fins 110, 120, and on the top surface of the substrate 100, and portions of the spacer layer are removed. In some embodiments, a pulling back process is performed to remove portions of the spacer layer. In some embodiments, the pulling back process is an anisotropic etching process. Therefore, after the pulling back process, the portions of the spacer layer on the top surface of the gate structures 150 are removed; the portions of the spacer layer on the top and side surfaces of the fins 110, 120 are removed; the portions of the spacer layer on the top surface of the dielectric layer 130 are removed. The portions of the spacer layer on the side surface of the gate structures 150 are remained and become the gate spacers 170.

After the pulling back process is performed, a cleaning process is performed. In some embodiments, an acidic chemical can be utilized in the cleaning process. For example, a wet clean through the utilization of HCl or the diluted hydrofluoric acid (DHF) is carried out to remove polymer from the surface of the structure. In some embodiments, the portions of the capping layer 140 uncovered by the gate structures 150 are removed during the cleaning process, and the gate spacers 170 are still remained after the cleaning process.

Figure 5:
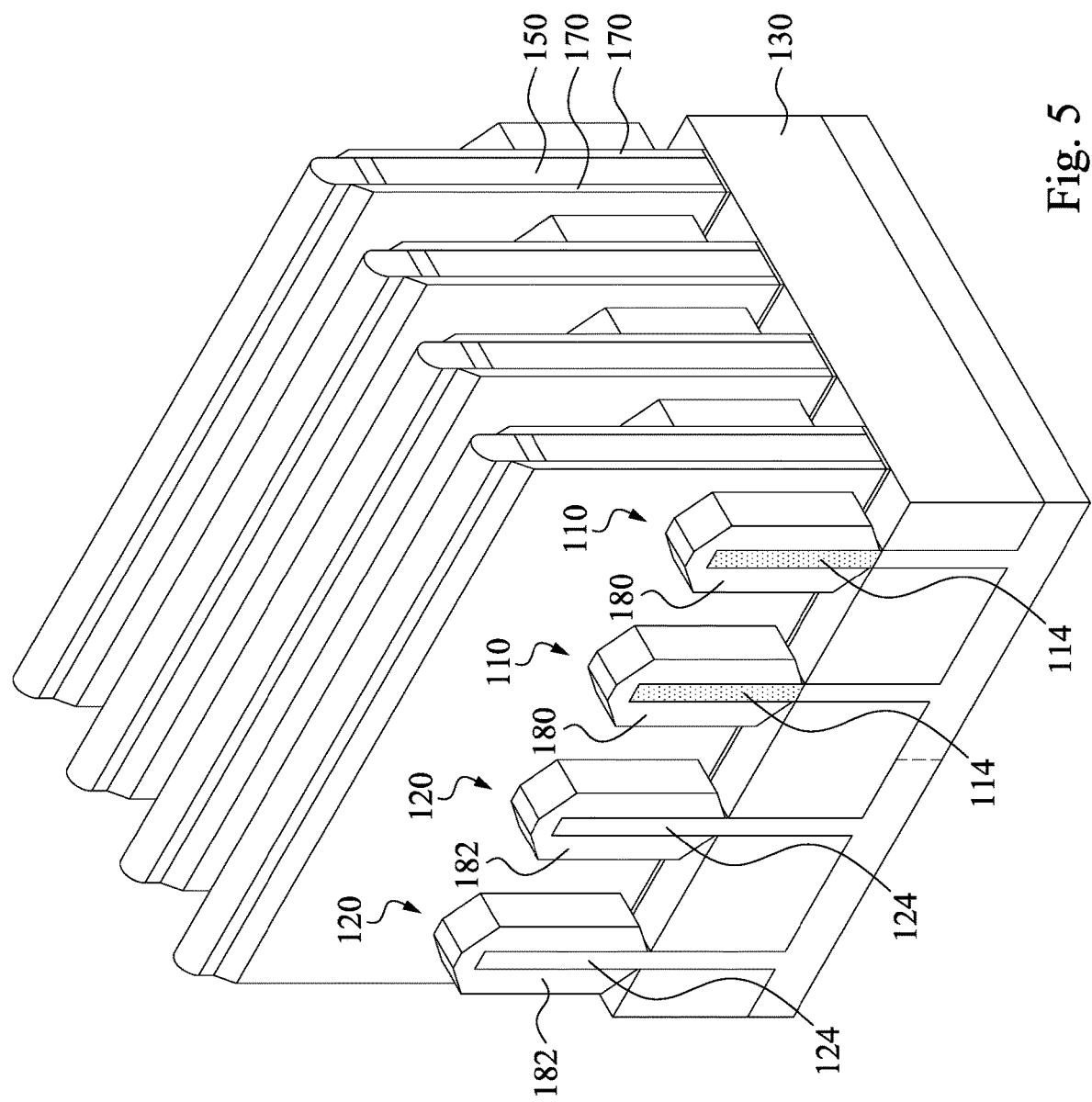
Figure 6:
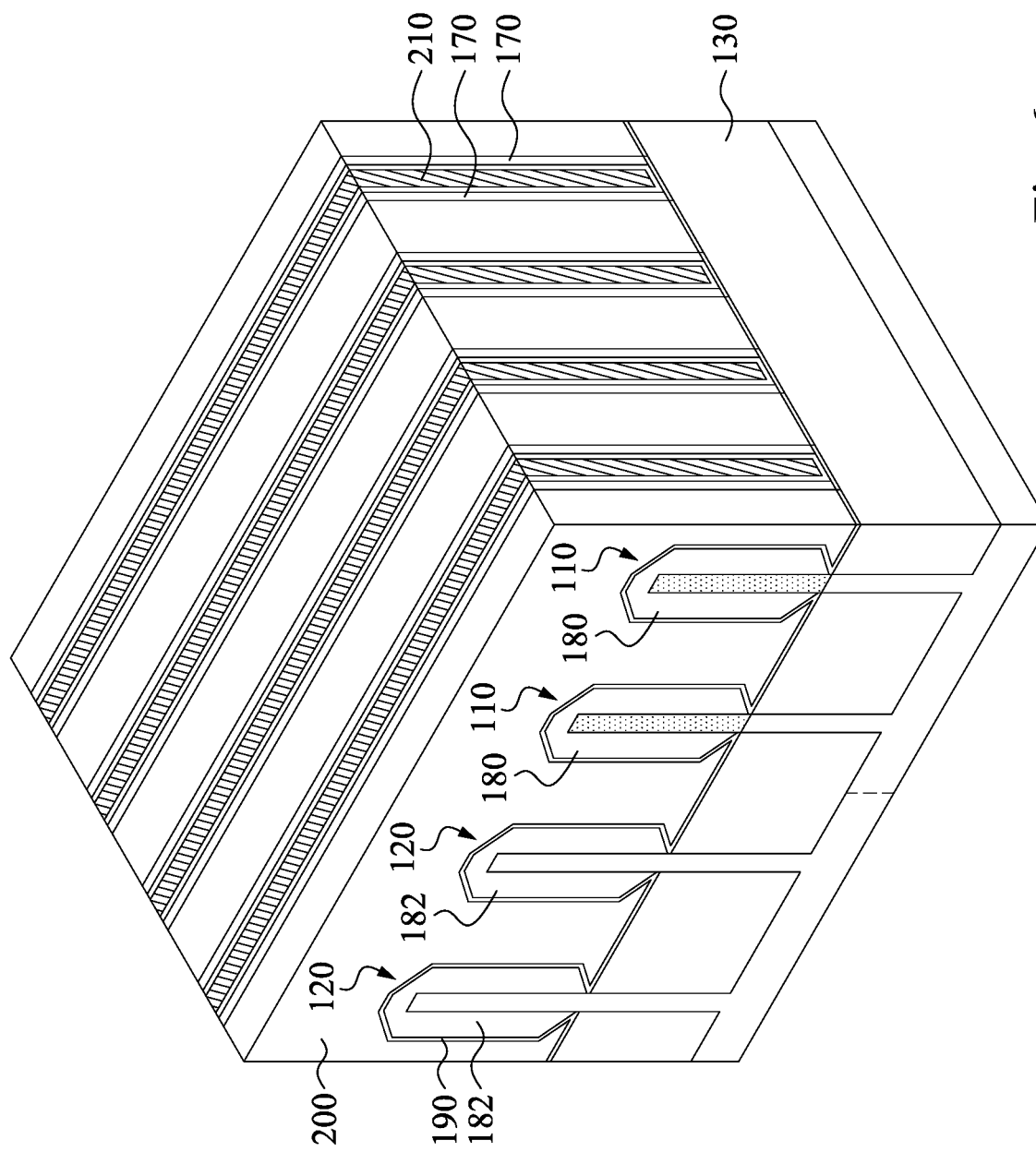

Reference is made to both FIG. 5 and FIG. 6. Epitaxial layers 180, 182 are formed covering the source/drain regions of the fins 110, 120. Since the lattice constant of the epitaxial layers 180, 182 is different from the fins 110, 120, the channel regions of the fins 110, 120 are strained or stressed to enable carrier mobility of the device and enhance the device performance. The source/drain regions are portions of the fins 110, 120 not covered by the gate structures 150, and the channel regions are the portions of the fins 110, 120 covered by the gate structures 150.

In some embodiments, the epitaxial layers 180, 182 surround the upper portions 114, 124 of the fins 110, 120 exposed by the gate structures 150, and the epitaxial layers 180, 182 connect the upper portions 114, 124 of the fins 110, 120 to the dielectric layer 130. In some embodiments, the epitaxial layers 180, 182 cover the upper portions 114, 124 of the fins 110, 120 exposed by the gate structures 150 and the gate spacers 170.

In some embodiments, the growth of the epitaxial layers 180, 182 over the fins 110, 120 continue until the epitaxial layers 180, 182 vertically extend above and laterally extend from the fins 110, 120. In some embodiments, the epitaxial layers 180, 182 may comprise a single layer or multilayer structure. In the single-layer embodiment, the epitaxial layers 180, 182 may comprise a silicon-containing material. In some embodiments, the epitaxial layers 182 such as phosphorous doped silicon (SiP) are epi-grown by a LPCVD process to form the source/drains of the n-type FinFET devices. The LPCVD process is performed at a temperature of about 500 degrees Celsius to about 750 degrees Celsius. In some other embodiments, the epitaxial layers 180, such as silicon germanium (SiGe), is epi-grown by a LPCVD process to form the source/drains of the p-type FinFET devices. The LPCVD process is performed at a temperature of about 400 degrees Celsius to about 650 degrees Celsius.

In the multilayer embodiment, the epitaxial layers 180, 182 may respectively comprise a III-V semiconductor material or a II-VI semiconductor material between the silicon-containing material and the source/drain regions the fins 110, 120. In some embodiments, the II-VI semiconductor material comprises a material selected from the group consisting of ZeSe, ZnO, CdTe, and ZnS. In some embodiments, the III-V semiconductor material comprises a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP.

In some embodiments, each of the epitaxial layers 180, 182 has a thickness is in a range from about 8 nm to about 16 nm, in which the thickness is along the direction of the epitaxial layers 180, 182 growing from the fins 110, 120. If the thickness of each of the epitaxial layers 180, 182 is greater than about 16 nm, the spaces between the adjacent epitaxial layers 180, 182 would not be able to provide sufficient isolation. If the thickness of each of the epitaxial layers 180, 182 is smaller than about 8 nm, the resistance of the device would be increased.

After the epitaxial layers 180, 182 are formed cladding the fins 110, 120, a contact etch stop layer 190 is deposited on the fins 110, 120, the dielectric layer 130, and the gate structures 150. Next, a flowable CVD is carried out to form an interlayer dielectric (ILD) layer 200 on the contact etch stop layer 190. A planarizing process, such as a chemical mechanical polishing (CMP) process is performed to partially remove the interlayer dielectric layer 200, the contact etch stop layer 190, and the mask features 160 on the gate structures 150, so that the top of the gate electrode composed of polysilicon within the gate structures 150 is exposed and substantially even with the surface of the interlayer dielectric layer 200. Alternatively, another approach could be utilized by first performing a CMP process to partially remove the interlayer dielectric layer 200 until reaching the contact etch stop layer 190, and then using a dry etching process to partially remove the interlayer dielectric layer 200, the contact etch stop layer 190, and the mask features 160 for exposing the top of the gate electrode of the gate structures 150.

A replacement metal gate (RMG) process is further conducted to form metal gates 210 on the substrate 100, in which each metal gate 210 includes a high-k dielectric layer and a work function metal layer. According to some embodiments, the replacement metal gate process could be carried out by first performing a selective dry etching or wet etching process, such as using etchants including ammonium hydroxide (NH$_4$OH) or tetramethylammonium hydroxide (TMAH) to remove the polysilicon layer from the gate structures 150 without etching the interlayer dielectric layer 200 and the gate spacers 170 for forming a recess between the gate spacers 170. The high-k dielectric layer and adequate work function metal layer are deposited into the recess, and the high-k dielectric layer and work function metal layer are planarized to form a metal gate 210 crossing the fins 110, 120.

The material of the high-k dielectric layer may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SBT), lead zirconate titanate PZT), barium strontium titanate (BST) or a combination thereof. The high-k dielectric layer can be formed through an ALD process or a metal-organic chemical vapor deposition (MOCVD) process, but is not limited thereto. The metal gates 210 contain one or a plurality of metal layer such as a work function metal layer, a barrier layer and a low-resistance metal layer. The work function metal layer is formed for tuning the work function of the metal gate 210 to be appropriate in an N-type FinFET device or a P-type FinFET device. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Figure 7:
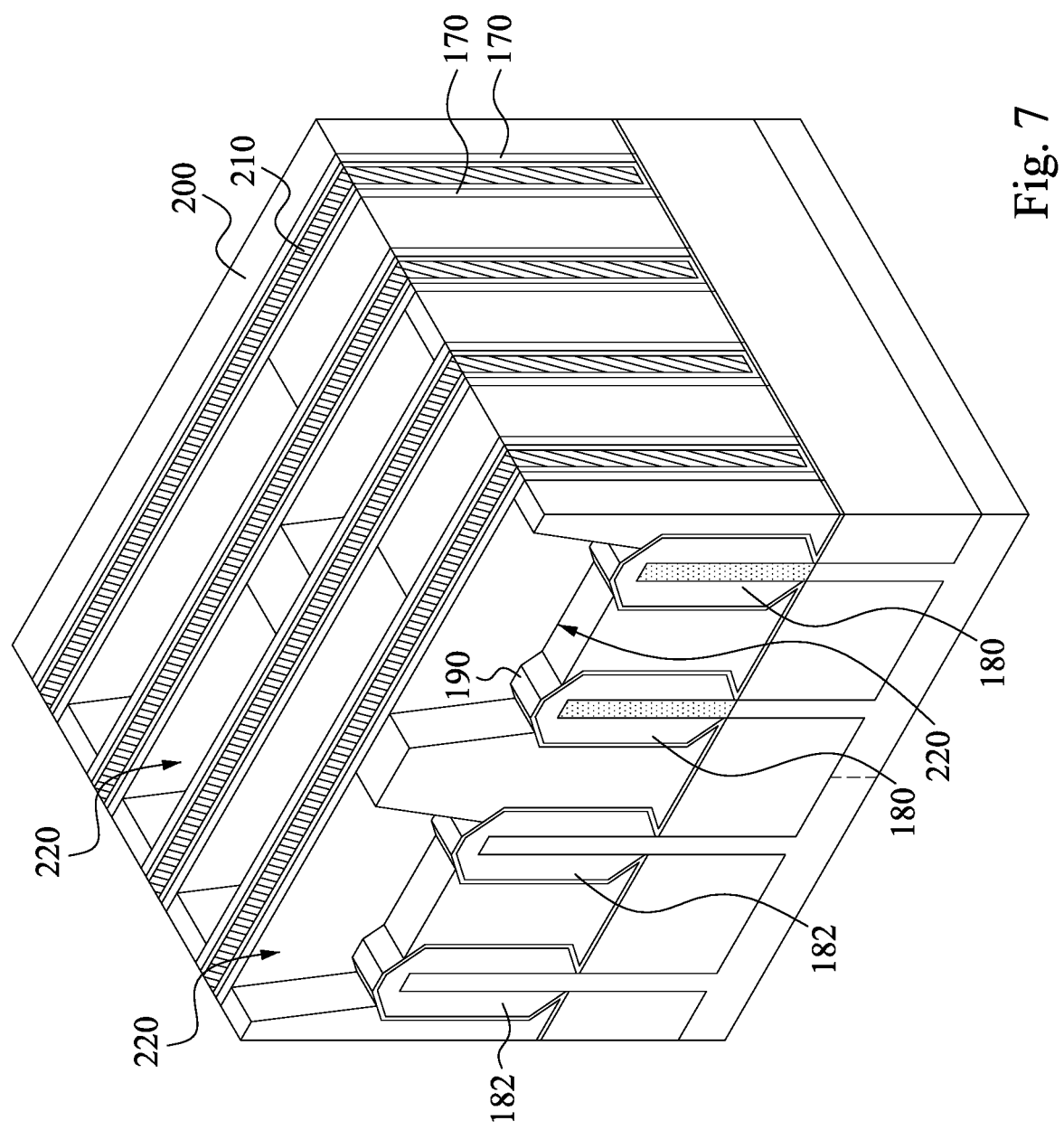

Reference is made to FIG. 7. One or more etching processes are performed to remove portions of the interlayer dielectric layer 200 thereby forming a plurality of contact holes 220 in the interlayer dielectric layer 200. In some embodiments, the etching process can be a wet etching process and is stopped at the contact etch stop layer 190. Namely, the epitaxial layers 180, 182 are protected by the contact etch stop layer 190 during the etching process. The position and the size of the contact holes 220 are determined according to the design requirements. In some embodiments, the thickness of the gate spacers 170 is reduced accordingly because of the forming of the contact holes 220.

Figure 8:
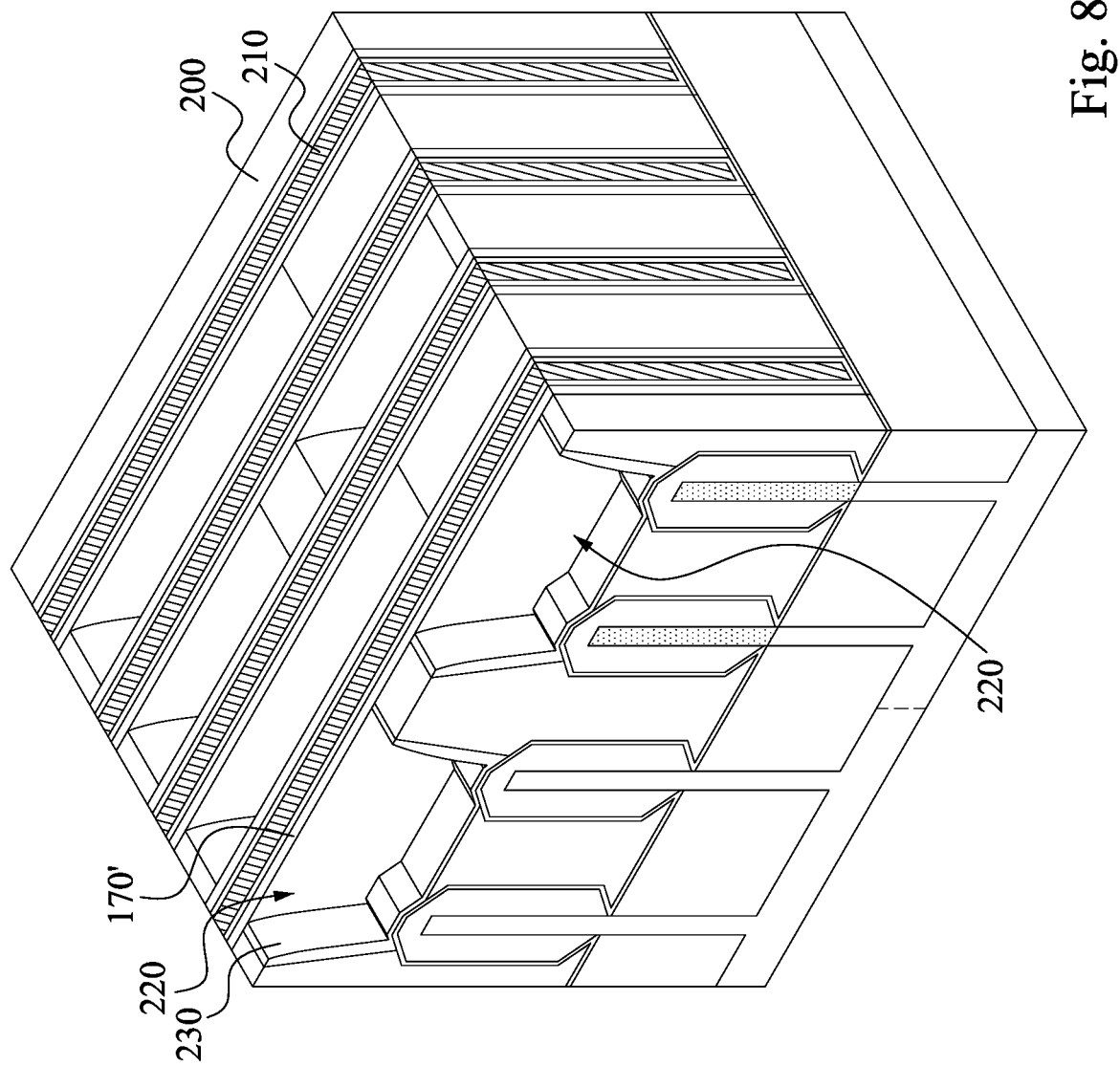

Reference is made to FIG. 8. An additional spacer layer 230 is deposited on the bottom surfaces and the side surfaces of the contact holes 220. The spacer layer 230 is deposited to compensate the thickness of the gate spacers 170 aside to the metal gates 210, such that the distance between the metal gates 210 and the following contacts can be controlled to enhance the reliability of the FinFET device. In some embodiments, the material of the additional spacer layer 230 can be the same or different from that of the gate spacers 170. For example, the material of the additional spacer layer 230 includes silicon nitride. The additional spacer layer 230 at the sidewalls of metal gates 210 can be regarded as a part of the gate spacers 170, and the combination thereof are referred as the gate spacers 170' in the following description.

Figure 9:
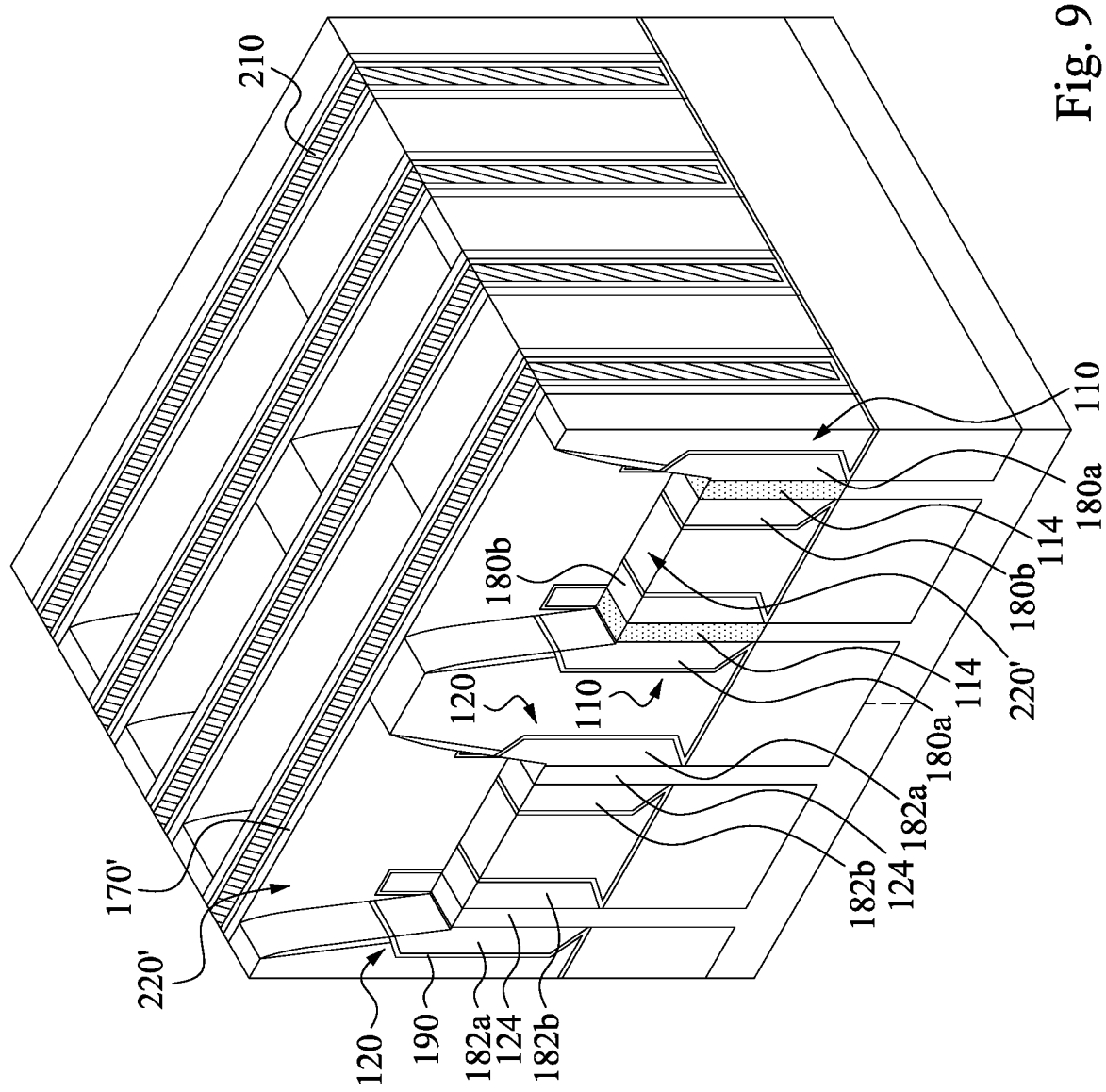

Reference is made to FIG. 9. An etching process is performed to define the profile of the contact holes 220'. In some embodiments, the etching process can be a dry etching process, such as blanket (non-masked) plasma etching process. The blanket plasma etching process is used to remove the portions of the spacer layer 230 and the contact etch stop layer 190 on the epitaxial layers 180, 182. In some embodiments, the contact holes 220' have trapezoid cross-section after the etching process. During the etching process, not only the exposed portions of the spacer layer 230 and the contact etch stop layer 190 are removed, portions of the epitaxial layers 180, 182, the upper portions 114, 124 of the fins 110, 120 are also removed. Therefore, the upper portions 114, 124 of the fins 110, 120 are exposed from the contact etch stop layer 190. The gate spacers 170' are still remained aside the metal gates 210 after the etching process.

In some embodiments, before the etching process, each of the upper portions 114, 124 of the fins 110, 120 wrapped by the epitaxial layers 180, 182 has a height in a range from about 40 nm to about 60 nm. After the etching process, the height of each of the upper portions 114, 124 of the fins 110, 120 wrapped by the epitaxial layers 180, 182 is in a range from about 30 nm to about 40 nm. The removed portions of the upper portions 114, 124 of the fins 110, 120 are about ⅕ to about ⅓ of the original upper portions 114, 124. If the ratio of the removed portions of the upper portions 114, 124 to the original upper portions 114, 124 is greater than about ⅓, the resistance of the device would be increased because silicides would be formed on portions of the epitaxial layers 180 that have an insufficient dopant concentration. If the ratio of the removed portions of the upper portions 114, 124 to the original upper portions 114, 124 is smaller than about ⅕, the resistance of the device would be increased as well because the exposed area of the epitaxial layers 180 might be too small to allow enough silicides to be formed thereon.

In some embodiments, the epitaxial layers 180 respectively have a first portion 180a and a second portion 180b at opposite sides of the upper portion 114, and the first portion 180a is not connected to the second portion 180b after the etching process. The height of the first portion 180a may not be the same as the height of the second portion 180b. For example, the first portion 180a can be higher than the second portion 180b in one of the epitaxial layers 180, or the second portion 180b can be higher than the first portion 180a in another one of the epitaxial layers 180. In some embodiments, the height difference between the first portion 180a and the second portion 180b is in a range from about 10 nm to about 20 nm. If the height difference between the first portion 180a and the second portion 180b is greater than about 20 nm, the resistance of the device would be increased because silicides would be formed on portions of the epitaxial layers 180 that have an insufficient dopant concentration. If the height difference between the first portion 180a and the second portion 180b is smaller than about 10 nm, the resistance of the device would be increased as well because the exposed area of the epitaxial layers 180, 182 might be too small to allow enough silicides to be formed thereon.

In some embodiments, the epitaxial layers 182 respectively have a first portion 182a and a second portion 182b at opposite sides of the upper portion 124, and the first portion 182a is not connected to the second portion 182b after the etching process. The height of the first portion 182a may not be the same as the height of the second portion 182b. For example, the first portion 182a can be higher than the second portion 182b in one of the epitaxial layers 182, or the second portion 182b can be higher than the first portion 182a in another one of the epitaxial layers 182.

In some embodiments, the composition of the epitaxial layers 182 at the n-type FinFET devices includes SiP, which is a thermal sensitive material. Thus the function of the epitaxial layers 182 may be decayed after the thermal process, such as doping process or annealing process. Therefore, there is a need to compensate the decay of the epitaxial layers 182.

Figure 10:
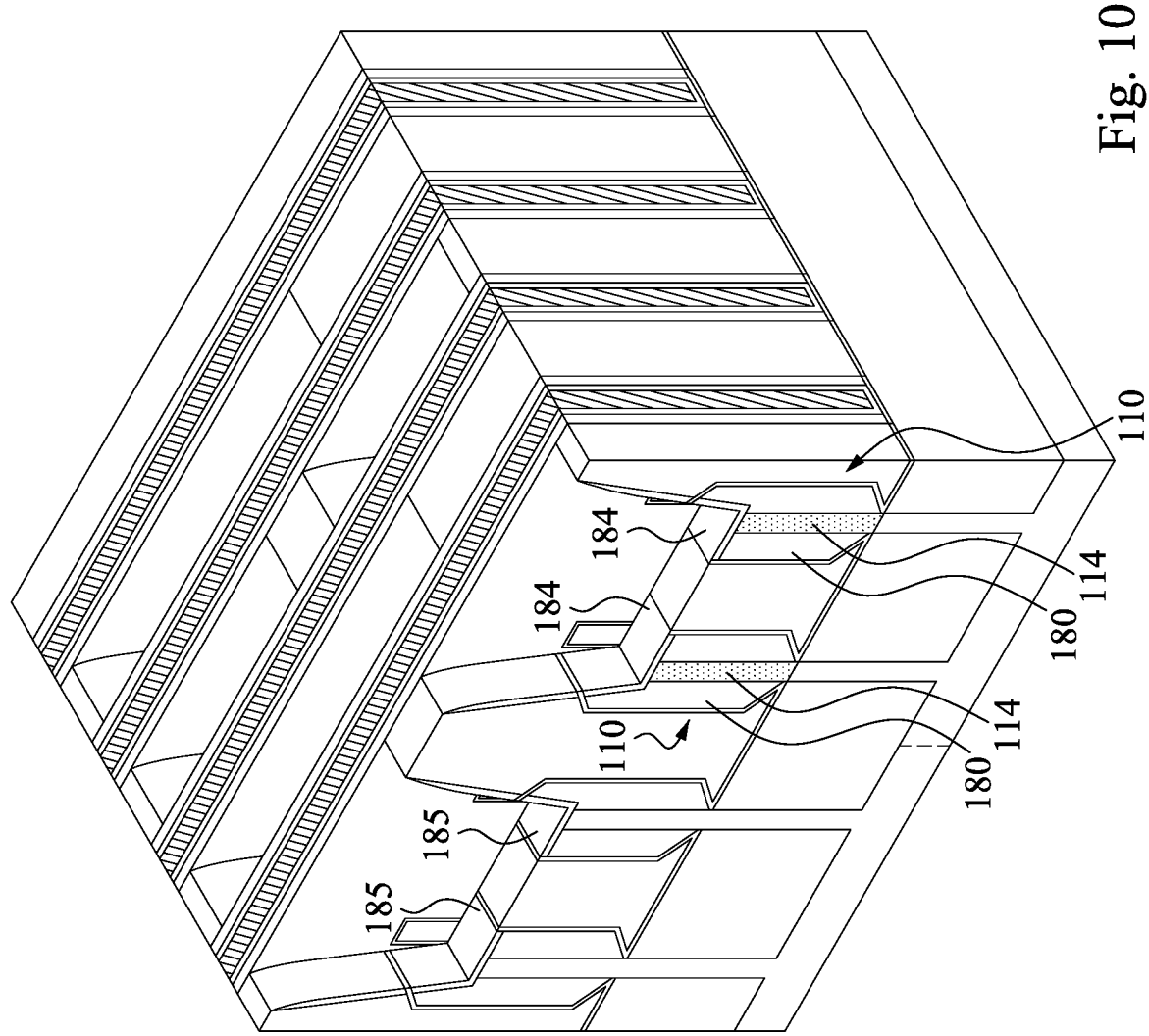

Reference is made to FIG. 10. An oxidation process is performed to the n-type FinFET devices and the p-type FinFET devices. At the p-type FinFET devices, the epitaxial layers 180 including SiGe are reacted and thereby forming silicon germanium oxide ($SiGeO_x$) layers 184 thereon. The $SiGeO_x$ layers 184 are self-aligned with the epitaxial layers 180 and the upper portions 114. In some embodiments, the $SiGeO_x$ layers 184 can be formed by using a thermal oxidation process, a chemical oxidation process, or any suitable oxidation process. The $SiGeO_x$ layers 184 are oxide layers having high germanium concentration, such as from about 50 at % to about 80 at %.

At the n-type FinFET devices, the epitaxial layers 182 including SiP are reacted and thereby forming native oxide layers 185 thereon. The native oxide layers 185 are germanium-free oxide because the seed material includes SiP. The native oxide layer 185 is further removed by using a pre-cleaning process, such as using a wet etching process that has high selectivity between germanium-free oxide and germanium-containing oxide. The chemical to the pre-cleaning process can be HCl or diluted hydrofluoric acid. During the pre-cleaning process, the etch rate of germanium-free oxide is faster than etch rate of germanium-containing oxide, so that germanium-free oxide layer 185 over n-type FinFET devices is removed while the germanium-containing oxide layers 184 over n-type FinFET devices remains to serve as a mask in the subsequent SiP epi growth to protect the epitaxial layers 180 and upper portions 114 of the fins 110 at the p-type FinFET devices in the following processes. As a result, a mask can be formed over SiGe without additional lithography processes.

Figure 11:
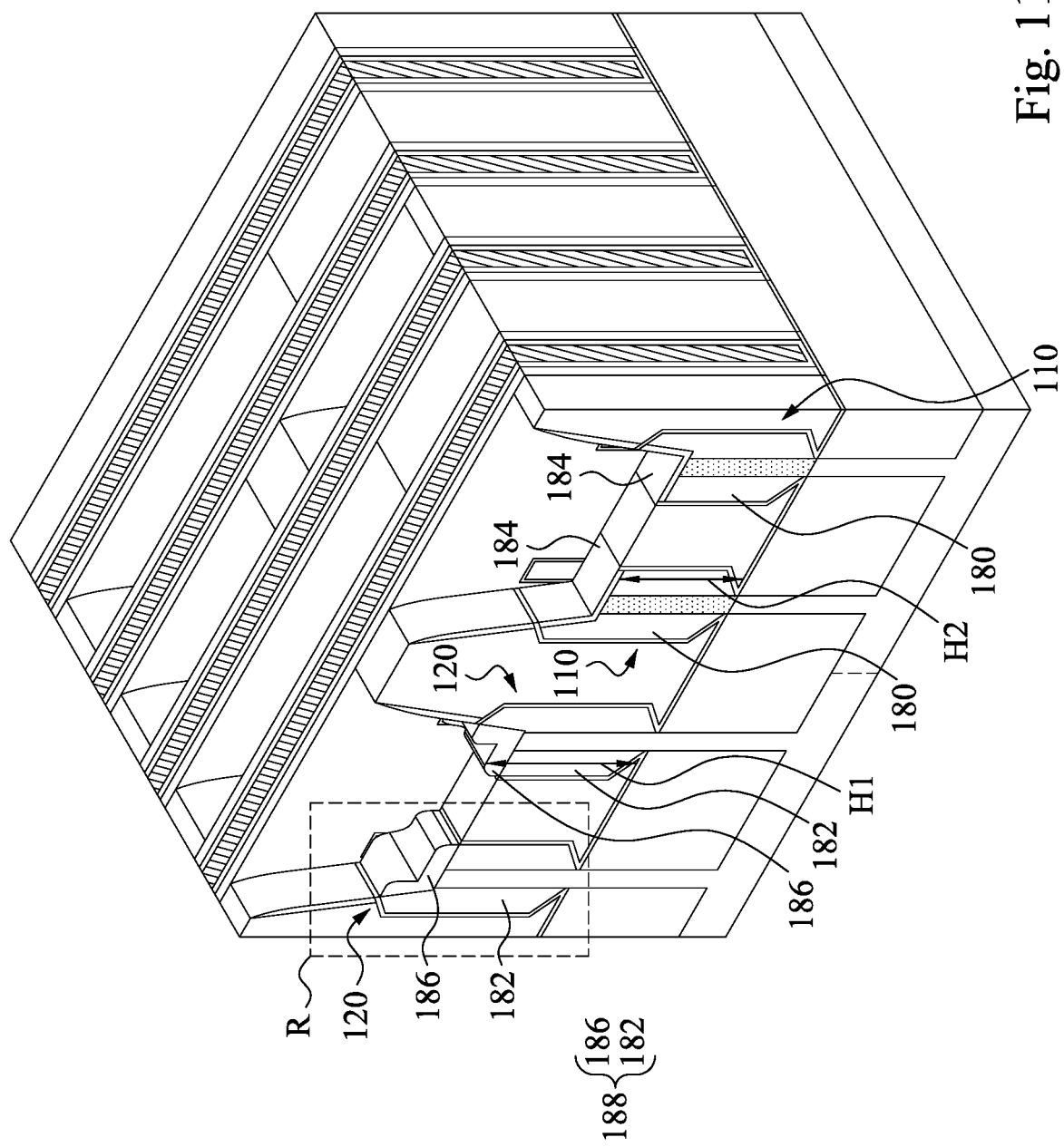

Reference is made to FIG. 11. Additional epitaxial contact portions 186 are formed on and in contact with the epitaxial layers 182 to prevent the deactivation of the epitaxial layers 182. In some embodiments, the material of the epitaxial contact portions 186 is substantially the same as the material of the epitaxial layers 182, such as SiP. In some embodiments, the process temperature of growing the epitaxial contact portions 186 on the epitaxial layers 182 is lower than the process temperature of forming the epitaxial layers 182. In some embodiments, the process temperature of growing the epitaxial contact portions 186 is in a range from about 400 degrees Celsius to about 550 degrees Celsius. If the process temperature of growing the epitaxial contact portions 186 is higher than about 550 degrees Celsius, the electrical property of the device would be adversely affected. If the process temperature of growing the epitaxial contact portions 186 is lower than about 400 degrees Celsius, the epitaxial contact portions 186 would not be formed. The epitaxial layers 182 and the epitaxial contact portions 186 are made by different process temperatures, thus an observable interface is present between the epitaxial layers 182 and the epitaxial contact portions 186. In some embodiments, the structure of the epitaxial layers 182 can be looser or denser than the structure of the epitaxial contact portions 186.

In some embodiments, the epitaxial contact portions 186 can be thicker than the $SiGeO_x$ layers 184. In some embodiments, each of the epitaxial contact portions 186 has a thickness in a range from about 3 nm to about 10 nm. The phosphorus doping concentration of the epitaxial contact portions 186 is higher than the phosphorus doping concentration of the epitaxial layers 182. In some embodiments, the phosphorus doping concentration of the epitaxial contact portions 186 is in a range from about 2E21 atoms/cm$^3$ to about 8E21 atoms/cm$^3$, and the phosphorus doping concentration of the epitaxial layers 182 is in a range from about 5E21 atoms/cm$^3$ to about 5E22 atoms/cm$^3$.

Figure 13:
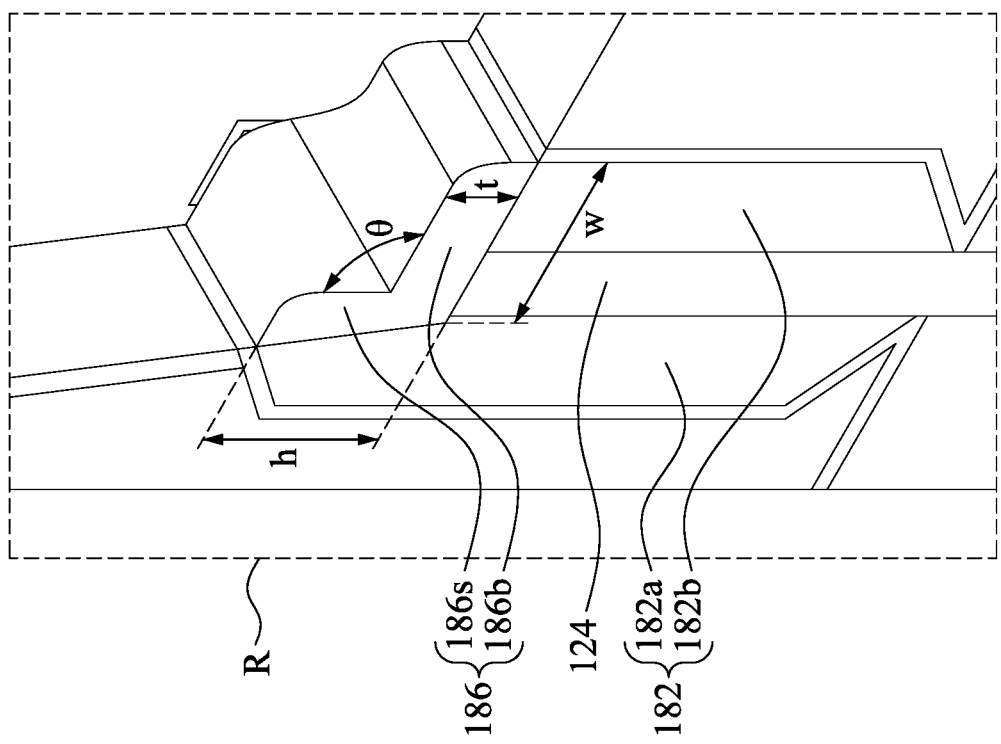
FIG. 13 is an enlarged view of the region R of FIG. 11.

Reference is made to both FIG. 11 and FIG. 13, in which FIG. 13 is an enlarged view of the region R. Each of the epitaxial contact portions 186 has a L-shaped profile and includes a bottom part 186b in contact with the top surface of the upper portion 124 of the fin 120 and the top surface of the second portion 182b of the epitaxial layer 182. Each of the epitaxial contact portions 186 further includes a sidewall part 186s connected to and protruding from the bottom part 186b. The sidewall part 186s is in contact with the exposed side surface of the first portion 182a of the epitaxial layer 182.

In some embodiments, the thickness t of the epitaxial contact portion 186 is in a range from about 3 nm to about 10 nm. If the thickness t of the epitaxial contact portion 186 is greater than about 10 nm, the cost would be increased but the resistance of the epitaxial contact portion 186 would not be decreased accordingly. If the thickness t of the epitaxial contact portion 186 is smaller than about 3 nm, the resistance of the epitaxial contact portion 186 would be increased.

In some embodiments, the width w of the bottom part 186b of the epitaxial contact portion 186 is in a range from about 10 nm to about 30 nm. If the width w of the bottom part 186b is greater than about 30 nm, the space between the adjacent epitaxial contact portions 186 would not be able to provide sufficient isolation. If the width w of the bottom part 186b is smaller than about 10 nm, the resistance of the device would be increased.

Figure 12:
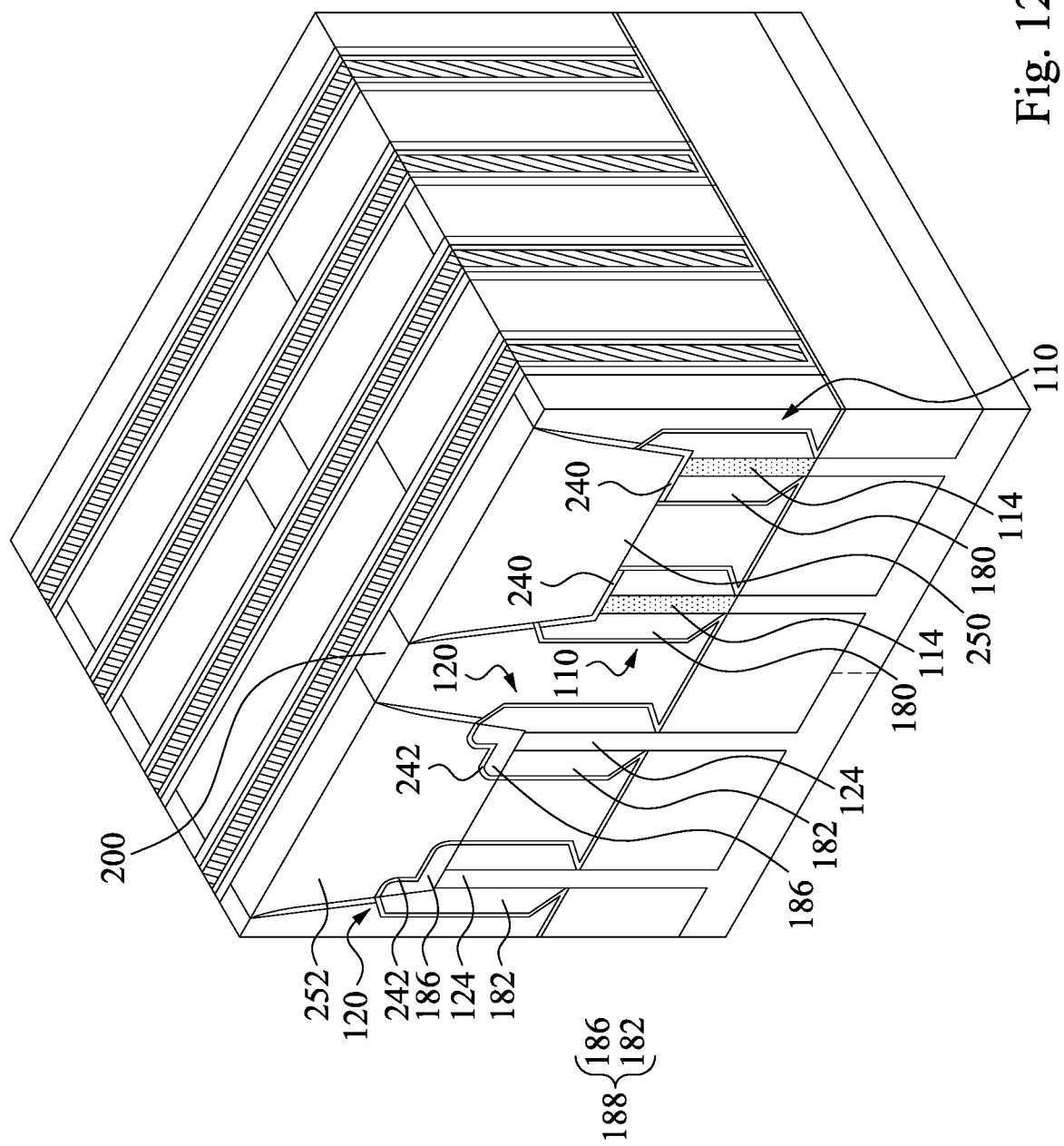

In some embodiments, the height h of the sidewall part 186s is in a range from about 10 nm to about 20 nm. The height h of the sidewall part 186s can be translated into the height difference between the first portion 180a (as shown in FIG. 9) and the second portion 180b (as shown in FIG. 9) because the epitaxial layers 180, 182 are etched by the same etching process. If the height h of the sidewall part 186s is greater than about 20 nm (i.e. the height difference between the first portion 180a (as shown in FIG. 9) and the second portion 180b (as shown in FIG. 9) is greater than about 20 nm), the resistance of the device would be increased because the silicides 240 (as shown in FIG. 12) might be formed on portions of the epitaxial layers 182 that have an insufficient dopant concentration. If the height h of the sidewall part 186s is smaller than about 10 nm (i.e. the height difference between the first portion 180a (as shown in FIG. 9) and the second portion 180b (as shown in FIG. 9) is smaller than about 10 nm), the resistance of the device would be increased as well because the surface of the epitaxial layers 180 exposed by the etching process of FIG. 9 might be too small to allow enough silicides to be formed thereon.

In some embodiments, the angle θ between the bottom part 186b and the sidewall part 186s is in a range from about 80 degrees to about 90 degrees. If the angle θ between the bottom part 186b and the sidewall part 186s is smaller than about 80 degrees, the contact to gate isolation would be unsatisfactory because the filling of the contact would become difficult.

After the epitaxial contact portions 186 are formed on the epitaxy layers 182, a removing process is performed to remove the SiGeO$_x$ layers 184. The removing process can be a dry etching process or a wet cleaning process, in which the chemical utilized in the wet etching process is different from the chemical in the pre-cleaning process. Due to the loss of the epitaxial layers 180 by SiGeO$_x$ layers 184 formation and removal, and the low temperature epitaxial contact portions 186 on the epitaxial layers 182 only, the height difference between the N/P source/drain epitaxial structures can be observed. In some embodiments, the epitaxial structures 188 including the epitaxial contact portions 186 and the epitaxial layers 182 are remained on the n-type FinFET devices, and the epitaxial layers 180 are remained on the p-type FinFET devices after the removal. The height H1 of the epitaxial structures 188 on the fins 120 of the n-type FinFET devices is higher than the height H2 of the epitaxial layers 180 on the fins 110 of the p-type devices. In some embodiments, the difference between the height H1 of the epitaxial structures 188 and the height H2 of the epitaxial layers 180 is in a range from about 5 nm to about 18 nm.

Reference is made to FIG. 12. A silicide process is performed to form silicides 240, 242 on the epitaxy layers 180 and on the epitaxial structures 188, respectively. In some embodiments, the silicide process includes forming blanket metal layer, reacting metal with underlying semiconductor to form silicide by annealing, and then removing unreacted metal by etching. Annealing process is utilized to convert the amorphous silicide film to a lower-resistance polycrystalline phase. The silicide process is sometimes used to form silicides 240, 242 in the contacts on the source and drain region to solve the problem of critical dimension tolerance.

After the silicide process, metal contact portions 250, 252 are formed in the contact holes. In some embodiments, each of the metal contact portions 250, 252 includes a barrier layer to prevent a subsequently formed conductor from diffusing into the interlayer dielectric layer 200. In some embodiments, the barrier layer includes tantalum (Ta), titanium (Ti) or the like. The barrier layer can be deposited by using PVD, CVD, PECVD, LPCVD, or other suitable deposition techniques.

The metal contact portions further include conductor formed over the barrier layer to fill the contact holes. In some embodiments, the conductor is formed as an interconnect structure in the interlayer dielectric layer 200. In some embodiments, the conductor is formed by a deposition process, such as a CVD process, a PVD process or a sputter deposition process. In some embodiments, the conductor includes tungsten (W), copper (Cu), or cobalt (Co).

The portion of conductor over the interlayer dielectric layer 200 is removed. In some embodiments, the removing process is chemical mechanical polishing (CMP) process performed to remove the excess portions of the conductor and barrier layer outside the contact holes and achieving a planarized surface. In some embodiments, the silicide 240 is disposed between the metal contact portion 250 and the upper portion 114 of the fin 110 at the p-type FinFET device, and the silicide 242 and the epitaxial contact portion 186 are disposed between the metal contact portion 252 and the upper portion 124 of the fin 120 at the n-type FinFET device.

According to above embodiments, the SiGeO$_x$ layers having high germanium concentration, which are formed by oxidizing the p-type epitaxial layers and self-align the p-type epitaxial layers, can be utilized as hard mask to protect the p-type epitaxial layers during the formation of the additional epitaxial contact portions on the fins at the n-type FinFET devices. In some embodiments, the additional epitaxial contact portions on the fins at the n-type FinFET devices are grown at the temperature lower than that of growing the epitaxial layers cladding the fins.

According to some embodiments of the disclosure, a semiconductor component includes an n-type device, which includes a first fin disposed on a substrate, a first epitaxial layer disposed on a sidewall of the first fin, a first contact disposed over the first fin and on the first epitaxial layer. The first contact includes an epitaxial contact portion and a metal contact portion disposed on the epitaxial contact portion. The first epitaxial layer and the epitaxial contact portion have an interface there-between.

According to some embodiments of the disclosure, a FinFET device includes a fin, an epitaxial layer disposed on a sidewall of the fin, a contact disposed on the epitaxial layer and on the fin. The contact includes an epitaxial contact portion and a metal contact portion disposed on the epitaxial contact portion. The doping concentration of the epitaxial contact portion is higher than a doping concentration of the epitaxial layer.

According to some embodiments of the disclosure, a semiconductor device includes a semiconductor fin, a source/drain epitaxial layer, and an epitaxial contact structure. The semiconductor fin extends from a substrate. The source/drain epitaxial layer has a first portion extending on a first side of the semiconductor fin and a second portion extending on a second side of the semiconductor fin. The first portion of the source/drain epitaxial layer has a greater height than the second portion of the source/drain epitaxial layer. The epitaxial contact structure extends along a notched corner formed from a sidewall of the first portion of the source/drain epitaxial layer, a top surface of the semiconductor fin and a top surface of the second portion of the source/drain epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor fin extending from a substrate;
a gate structure extending across the semiconductor fin;
source/drain structures on opposite sides of the gate structure; and
a contact structure over a first one of the source/drain structures, the contact structure comprising a semiconductor contact and a metal contact over the semiconductor contact, wherein the semiconductor contact has a higher dopant concentration than the first one of the source/drain structures, and the first one of the source/drain structures comprises a first portion and a second portion at opposite sides of the semiconductor fin and interfacing the semiconductor contact, wherein the semiconductor contact forms an interface with a top surface of the semiconductor fin.

2. The device of claim 1, wherein the semiconductor contact has an L-shaped cross section.

3. The device of claim 1, further comprising:
a silicide region interposing the semiconductor contact and the metal contact.

4. The device of claim 3, wherein the silicide region has a stepped profile.

5. The device of claim 1, wherein the source/drain structures are of n-type.

6. The device of claim 1, wherein the semiconductor contact is of n-type.

7. The device of claim 1, wherein the first portion of the first one of the source/drain structures has a topmost position higher than a topmost position of the second portion of the first one of the source/drain structures.

8. The device of claim 1, further comprising:
a first silicide region over one of the source/drain structures;

p-type source/drain structures over another semiconductor fin; and
a second silicide region over one of the p-type source/drain structures, wherein the second silicide region interfaces said another semiconductor fin, but the first silicide region is spaced apart from said semiconductor fin.

9. A device comprising:
an n-type transistor comprising a first fin extending from a substrate, a first gate structure extending across the first fin, first epitaxial structures on opposite sides of the first gate structure, and a first silicide region over one of the first epitaxial structures; and
a p-type transistor comprising a second fin extending from the substrate, a second gate structure extending across the second fin, second epitaxial structures on opposite sides of the second gate structure, and a second silicide region over one of the second epitaxial structures, wherein the second silicide region interfaces the second fin, and the first silicide region is spaced apart from the first fin, wherein the first epitaxial structures of the n-type transistor have a height higher than a height of the second epitaxial structures of the p-type transistor.

10. The device of claim 9, wherein each of the first epitaxial structures comprises an epitaxial source/drain region and an epitaxial contact region over the epitaxial source/drain region, and the epitaxial contact region has a phosphorous concentration greater than a phosphorous concentration of the epitaxial source/drain region.

11. The device of claim 9, wherein a top surface of one of the first epitaxial structures of the n-type transistor is higher than a top surface of one of the second epitaxial structures of the p-type transistor.

12. The device of claim 9, wherein the second fin of the p-type transistor is formed of a different material than the first fin of the n-type transistor.

13. The device of claim 9,
wherein the first silicide region and the second silicide region have different profiles.

14. The device of claim 13, further comprising:
a first metal contact over the first silicide region; and
a second metal contact over the second silicide region, wherein an interface formed by the first metal contact and the first silicide region has a different profile than an interface formed by the second metal contact and the second silicide region.

15. A device comprising:
an n-type transistor comprising a first fin extending from a substrate, a first gate structure extending across the first fin, and n-type source/drain structures on opposite sides of the first gate structure;
a p-type transistor comprising a second fin extending from the substrate, a second gate structure extending across the second fin, and p-type source/drain structures on opposite sides of the second gate structure;
a first silicide region above one of the n-type source/drain structures; and
a second silicide region above one of the p-type source/drain structures, wherein the second silicide region interfaces the second fin, but the first silicide region is spaced apart from the first fin.

16. The device of claim 15, further comprising:
an epitaxial contact over a first one of the n-type source/drain structures, the epitaxial contact having a higher phosphorous concentration than the first one of the n-type source/drain structures.

17. The device of claim 16, wherein the first one of the n-type source/drain structures has a first portion on a first side of the first fin and a second portion on a second side of the first fin, and the epitaxial contact extends along a notched corner formed from a sidewall of the first portion of the first one of the n-type source/drain structures, a top surface of the first fin, and a top surface of the second portion of the first one of the n-type source/drain structures.

18. The device of claim 16, wherein the first silicide region is spaced apart from the first fin by the epitaxial contact.

19. The device of claim 16, wherein the epitaxial contact has an L-shaped profile.

20. The device of claim 15, wherein the first silicide region has a different profile than the second silicide region.

* * * * *